(12) United States Patent
Tamura et al.

(10) Patent No.: US 7,883,961 B2
(45) Date of Patent: Feb. 8, 2011

(54) MANUFACTURING METHOD FOR FERROELECTRIC MEMORY DEVICE

(75) Inventors: Hiroaki Tamura, Shimosuwa (JP); Masaki Kurasawa, Kawasaki (JP); Hideki Yamawaki, Kawasaki (JP)

(73) Assignees: Seiko Epson Corporation (JP); Fujitsu Semiconductor Limited (JP)

( * ) Notice: Subject to any disclaimer, the term of this patent is extended or adjusted under 35 U.S.C. 154(b) by 688 days.

(21) Appl. No.: 11/998,176

(22) Filed: Nov. 28, 2007

(65) Prior Publication Data
US 2008/0145953 A1 Jun. 19, 2008

(30) Foreign Application Priority Data
Nov. 29, 2006 (JP) .............................. 2006-321470

(51) Int. Cl.
*H01L 21/8242* (2006.01)
(52) U.S. Cl. ...................... 438/240; 257/306; 257/310; 257/E21.664; 257/E21.648
(58) Field of Classification Search .................. 257/295, 257/303, 306, 310, E21.664, E21.274, E21.648; 438/239, 240, 253, 393, 396
See application file for complete search history.

(56) References Cited
U.S. PATENT DOCUMENTS
5,840,615 A * 11/1998 Aoki et al. .................. 438/396
6,946,395 B2 * 9/2005 Marsh ........................ 438/686
7,439,195 B2 * 10/2008 Vaartstra et al. ............. 438/786

FOREIGN PATENT DOCUMENTS
JP     2003-324101     11/2003

* cited by examiner

*Primary Examiner*—David Vu
(74) *Attorney, Agent, or Firm*—Harness, Dickey & Pierce, P.L.C.

(57) ABSTRACT

A manufacturing method for a ferroelectric memory device including: forming a lower electrode; forming an electrode oxide film composed of an oxide of a constituent material of the lower electrode; forming a first ferroelectric layer on the lower electrode by reaction between organometallic source material gas and oxygen gas; forming a second ferroelectric layer on the first ferroelectric layer by reaction between organometallic source material gas and oxygen gas; and forming an upper electrode on the second ferroelectric layer. In the method, the oxygen gas in the forming of the first ferroelectric layer is in an amount less than the amount of oxygen necessary for reaction of the organometallic source material gas. In the method, the oxygen gas in the forming of the second ferroelectric layer is in an amount greater than the amount of oxygen necessary for reaction of the organometallic source material gas.

6 Claims, 9 Drawing Sheets

MANUFACTURING METHOD FOR FERROELECTRIC MEMORY DEVICE

CROSS-REFERENCE TO RELATED APPLICATION

This application claims priority from Japanese Patent Application No. 2006-321470, filed on Nov. 29, 2006, the contents of which are incorporated herein by reference.

BACKGROUND

1. Technical Field

The present invention relates to manufacturing methods for ferroelectric memory devices having ferroelectric capacitors.

2. Related Art

A ferroelectric memory device (FeRAM) is a nonvolatile memory that uses spontaneous polarization of ferroelectric material and is capable of low voltage and high speed operations. In such a ferroelectric memory device, its memory cell can be formed from one transistor and one capacitor (1T/1C), such that integration to the level of DRAM is possible. Accordingly, ferroelectric memory devices are highly expected as large capacity nonvolatile memories. As the ferroelectric material, perovskite type oxides such as lead zirconate titanate (Pb (Zi, Ti) $O_3$: PZT), and bismuth layered compounds such as strontium bismuth tantalate ($SrBi_2TaO_9$: SBT) can be enumerated.

In order to make the aforementioned ferroelectric material exhibit its maximum ferroelectric characteristic, its crystal orientation is extremely important. For example, when PZT is used as the ferroelectric material, a predominant orientation exists depending on its crystal system. Generally, when PZT is used in memory devices, titanium-rich compositions that contain a greater amount of Ti compared to Zr is used in order to obtain greater spontaneous polarization. In such a composition range, PZT belongs to a tetragonal system, and its spontaneous polarization axis aligns with the c-axis. In this case, ideally, the maximum polarization can be obtained by orienting it in the c-axis, which is in effect very difficult, and a-axis oriented components perpendicular to the c-axis concurrently exist. Because the a-axis orientated components do not contribute to polarization inversion, the ferroelectric characteristic may be degraded.

In this respect, it has been conceived to orient the a-axis in a direction offset at a predetermined angle from the substrate normal line by making the crystal orientation of PZT to (111). As a result, the polarization axis has a component in the substrate normal line direction, and thus can contribute to polarization inversion. On the other hand, the c-axis oriented component concurrently has its polarization axis oriented to a predetermined offset angle with respect to the substrate normal line direction, such that a certain amount of loss occurs in the amount of surface charge induced by polarization inversion. However, the entire crystal components can be made to contribute to polarization inversion, such that the charge retrieving efficiency significantly excels, compared to the case of the c-axis orientation.

In order to make PZT to have a (111) orientation, the crystal orientation of the lower electrode on which the PZT film is formed is important. As the material composing the lower electrode, a noble metal such as Ir (iridium) may be used in consideration of its thermal and chemical stability. However, for obtaining the (111)-oriented PZT film, the r film needs to be oriented in <111>. However, because the self-orientation properties of the Ir film are weak, the Ir film needs to be formed on a base layer whose crystal orientation is in <111>. However, even when the Ir film is oriented to (111), it has been difficult to make the crystal orientation of the PZT film in <111>.

In view of the above, there has been proposed a method in which an IrOx film that is an oxide of Ir is formed by applying an oxidation treatment to a surface of an Ir film that forms a lower electrode, and PZT is formed on the surface of the IrOx film by a MOCVD (Metal Organic Chemical Vapor Deposition) method, whereby the PZT has a (111) orientation. For example, Japanese Unexamined Patent Application, First Publication No. 2003-324101 is an example of related art.

However, the aforementioned manufacturing method for a ferroelectric memory device still entails the following problems. Because the oxide film is formed by thermal oxidation, it is difficult to control the film quality of the oxide film. For example, when a uniform oxide film is not formed and localized excessive oxidation occurs, hillocks that are small protuberances may be generated in the lower electrode due to volume expansions caused by the localized excessive oxidation. Also, because the oxide film is formed at the lower electrode by thermal oxidation advancing from its surface layer portion toward its inner layer portion, oxidation is inhibited by the oxide film formed on the surface, and it would become difficult for the oxidation to advance to an inner layer portion of the lower electrode. In other words, the oxide film formed on the surface shows an oxidation barrier properties and oxidation becomes difficult to advance to an inner layer portion of the lower electrode, such that it is difficult to increase the oxygen concentration of the lower electrode. As an oxide film having the appropriate oxygen concentration and appropriate film thickness cannot be obtained, a problem occurs in that the crystal orientation of a ferroelectric layer formed thereon can not be controlled (is not stable). Furthermore, because the oxidation treatment in which the lower electrode is exposed to an oxygen atmosphere at high temperatures is conducted, other elements may be thermally impacted.

SUMMARY

An advantage of some aspects of the invention is to provide a manufacturing method for a ferroelectric memory device, in which its ferroelectric layer can be made to have more uniform crystal orientation.

An aspect of the invention provides a manufacturing method for a ferroelectric memory having a ferroelectric capacitor, the method including: forming a lower electrode; forming, on the lower electrode, an electrode oxide film composed of an oxide of a constituent material of the lower electrode; forming a first ferroelectric layer on the lower electrode by reaction between organometallic source material gas and oxygen gas; forming a second ferroelectric layer on the first ferroelectric layer by reaction between organometallic source material gas and oxygen gas; and forming an upper electrode on the second ferroelectric layer. In the method, the oxygen gas in the forming of the first ferroelectric layer is in an amount less than the amount of oxygen necessary for reaction of the organometallic source material gas. In the method, the oxygen gas in the forming of the second ferroelectric layer is in an amount greater than the amount of oxygen necessary for reaction of the organometallic source material gas.

According to the aspect of the invention, the electrode oxide film is formed on the lower electrode, such that the film quality of the electrode oxide film can be readily made uniform, compared to the case in which an oxidation treatment is applied to the lower electrode thereby oxidizing the surface of the lower electrode to form an oxide film. By this, the crystal orientation of the ferroelectric layer formed on the lower electrode can be made uniform In other words, by forming the electrode oxide film on the lower electrode, the electrode oxide film can be uniformly formed in a thick film thickness, compared to the case where a thermal oxidation treatment is conducted. By this, in the first ferroelectric layer forming step, the first ferroelectric layer is uniformly crystallized on the whole area of a wafer, and the ratio of the required orientation in the first ferroelectric layer can be increased.

More specifically, in the first ferroelectric layer forming step, the oxygen is supplied in an amount less than the amount of oxygen necessary for reaction of the organometallic source material gas, such that oxygen within the electrode oxide film is released in a reducing atmosphere for reaction of the organometallic source material gas. For this reason, when forming the first ferroelectric layer, the first ferroelectric layer is crystallized and deposited through depriving oxygen contained in at least a portion of the oxide film including its upper layer. In this instance, the reduced electrode oxide film becomes a lower electrode, and the first ferroelectric layer is controlled to the required crystal orientation according to the crystal orientation of the lower electrode.

Because the thick electrode oxide film is uniformly formed as described above, the first ferroelectric layer is uniformly formed in a required crystal orientation. Then, in the second ferroelectric layer forming step, by supplying a sufficient amount of oxygen necessary for the reaction, the second ferroelectric layer is formed in high quality with few oxygen deficiency. Because the first ferroelectric layer having a required crystal orientation acts as a seed layer, the second ferroelectric layer also has the required crystal orientation.

Accordingly, the crystal orientation of the ferroelectric layer formed on the lower electrode can be made uniform on the whole area of the substrate, and the crystal orientation in each of the substrates can be made uniform.

Also, the electrode oxide film can be formed at lower temperatures, compared to the method that performs a thermal oxidation treatment, such that thermal impacts on other elements can be reduced.

In the invention, the amount of oxygen necessary for reaction of the organometallic source material gas is the sum of the amount of oxygen required for burning carbon and hydrogen originated from materials of the organometallic source material gas and releasing them as $CO_2$ (carbon dioxide) and $H_2O$ (water), and the amount of oxygen required for crystallizing ferroelectric materials composing the ferroelectric layer.

It is preferable that, in the manufacturing method for the ferroelectric memory device of the aspect of the invention, the electrode oxide film be formed by a sputter method in the forming of the electrode oxide film.

In the aspect of the invention, the electrode oxide film having a uniform film quality can be formed in a low temperature state by using a sputter method.

It is preferable that, in the manufacturing method for the ferroelectric memory device of the aspect of the invention, a partial pressure of oxygen gas in an atmospheric gas during sputtering be greater than or equal to 20% but less than or equal to 40% in the forming of the electrode oxide film.

According to the aspect described above, the first ferroelectric layer to be formed on the electrode oxide film can be more stably formed in a required crystal orientation. More specifically, by setting the partial pressure of the oxygen gas to be greater than or equal to 20%, the formed electrode oxide film is plentifully oxidized and is prevented from becoming closer to a metallic state. Also, by setting the partial pressure of the oxygen gas to be less than or equal to 40%, the formed electrode oxide film is prevented from becoming excessively stabilized by oxidation and difficult to be reduced, thereby preventing the surface structure (orientation) of the lower electrode layer (Ir) disposed therebelow from becoming impossible to be transmitted to the first ferroelectric layer (PZT). Accordingly, the first ferroelectric layer can be readily formed in a required crystal orientation.

It is preferable that, in the manufacturing method for the ferroelectric memory device of the aspect of the invention, the electrode oxide film have a film thickness less than or equal to 30 nm.

According to the aspect of the invention described above, the film thickness of the electrode oxide film is set to be greater than or equal to 0 nm but less than or equal to 30 nm, whereby the electrode oxide film is prevented from becoming excessively thick, thereby preventing the surface structure (orientation) of the electrode (Ir) disposed therebelow from becoming impossible to be transmitted to the first ferroelectric layer (PZT), and the ferroelectric layer can be more stably formed in a required crystal orientation.

It is preferable that, in the manufacturing method for the ferroelectric memory device of the aspect of the invention, the amount of oxygen in the oxygen gas in the forming of the first ferroelectric layer be greater than or equal to 0.1 times but less than 1.0 times the amount of oxygen necessary for reaction of the organometallic source material gas.

It is preferable that, in the manufacturing method for the ferroelectric memory device of the aspect of the invention, the amount of oxygen in the forming of the second ferroelectric layer be greater than or equal to 1.0 times the amount of oxygen necessary for reaction of the organometallic source material gas.

DESCRIPTION OF EXEMPLARY EMBODIMENTS

A manufacturing method for a ferroelectric memory device in accordance with an embodiment of the invention is described below with reference to the accompanying drawings. The scale of each of the members differs from one another in each of the figures used for the following description such that each of the members has a recognizable size.

Ferroelectric Memory Device

Figure 1:
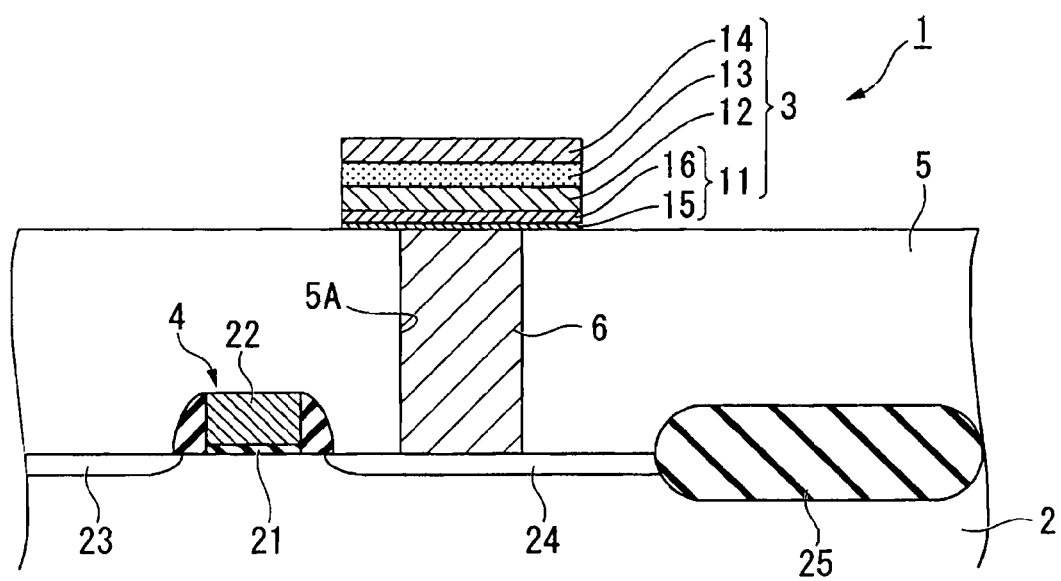
FIG. 1 is a schematic cross-sectional view of a ferroelectric memory device in accordance with an embodiment of the invention.

First, a ferroelectric memory device that is manufactured by a manufacturing method for a ferroelectric memory device in accordance with this embodiment is described with reference to FIG. 1. FIG. 1 schematically shows a cross-sectional view in enlargement of the ferroelectric memory device. As shown in FIG. 1, the ferroelectric memory device 1 includes a semiconductor substrate 2, and a ferroelectric capacitor 3 and a transistor 4 formed on the semiconductor substrate 2.

The semiconductor substrate 2 is composed of, for example, silicon (Si), and an interlayer dielectric film 5 composed of, for example, silicon dioxide ($SiO_2$) is formed on its upper surface. Furthermore, an opening section 5A that penetrates the interlayer dielectric film 5 is formed in an area of the interlayer dielectric film 5 corresponding to a second impurity region layer 24 to be described below. A plug 6 is provided in the opening section 5A. The plug 6 is composed of a conductive material filled in the opening section 5A, and may be composed of, for example, tungsten (W), molybdenum (Mo), tantalum (Ta), titanium (Ti), or nickel (Ni).

The ferroelectric capacitor 3 includes a base layer 11 formed on the interlayer dielectric film 5 and the plug 6, a lower electrode 12 laminated on the base layer 11, a ferroelectric layer 13 laminated on the lower electrode 12, and an upper electrode 14 laminated on the ferroelectric layer 13.

The base layer 11 includes a conductive film 15 conductively connected to the plug 6, and a barrier layer 16 laminated on the conductive film 15. The conductive film 15 is composed of, for example, titanium nitride (TiN). The barrier layer 16 is composed of a material including crystalline and having conductivity and oxygen barrier property, and may be composed of, for example, TiAlN, TiAl, TiSiN, TiN, TaN, or TaSiN, and may preferably be composed of TiAlN.

The lower electrode 12 is composed of at least one of, for example, Ir, Pt (platinum), Ru (ruthenium), Rh (rhodium), Pd (palladium), and Os (osmium), or an alloy thereof, or an oxide thereof. The lower electrode 12 may preferably be composed of Ir or Pt, and more preferably be composed of Ir. The lower electrode 12 may be in a single layer film or a multilayer film of laminated layers.

When the lower electrode 12 is crystalline, the crystal orientation of the lower electrode and the crystal orientation of the barrier layer 16 may preferably be in an epitaxial orientation relation at an interface between them. In this case, the crystal orientation of the lower electrode 12 and the crystal orientation of the ferroelectric layer 13 may also preferably be in an epitaxial orientation relation at an interface between them.

For example, when the barrier layer 16 belongs to the cubic crystal system, and its crystal orientation is in a <111> axis, or when the barrier layer 16 belongs to a hexagonal crystal system, and its crystal orientation is in a <001> axis, the crystal orientation of the lower electrode 12 may preferably be in a <111> axis. With this structure, when the ferroelectric layer 13 is formed on the lower electrode 12, the crystal orientation of the ferroelectric layer 13 can be readily made along a <111> axis.

The ferroelectric layer 13 is composed of a ferroelectric material having a perovskite crystal structure that is expressed by a general formula of $A_{1-b}B_{1-a}X_aO_3$. The element A in the general formula includes Pb. A part of Pb may be replaced with La, Ca, and Sr. The element B is composed of at least one of Zr and Ti. The element X may be composed of at least one of V (vanadium), Nb (niobium), Ta, Cr (chrome), Mo (molybdenum), W (tungsten), and Mg (magnesium). As a ferroelectric material composing the ferroelectric layer 13, a known material, such as, for example, PZT, SBT, and (Bi, La)$_4$Ti$_3$O$_{12}$ (bismuth lanthanum titanate: BLT) can be used. Above all, PZT is suitable.

When PZT is used as the ferroelectric material, Ir may preferably be used as the lower electrode 12 from the viewpoint of the reliability of the ferroelectric capacitor 3. When PZT is used as the ferroelectric material, the content of Ti in the PZT may preferably be greater than the content of Zr in order to obtain a greater amount of spontaneous polarization. Moreover, when the ferroelectric layer 13 is composed of PZT, and the content of Ti in the PZT is greater than the content of Zr therein, the crystal orientation of the PZT is preferably be in a (111) orientation, because the hysteresis characteristic of the PZT is excellent in this orientation.

The upper electrode 14 may be composed of any of the materials described above used for the lower electrode 12, or may be composed of Al (aluminum), Ag (silver), Ni (nickel) or the like. Also, the upper electrode 14 may be in a single layer film, or a multilayer film of laminated layers. The upper electrode 14 may preferably be composed of Pt or a laminated film of layers of IrOx and Ir.

The transistor 4 includes a gate dielectric layer 21 formed in a part of the surface of the semiconductor substrate 2, a gate conductive layer 22 formed on the gate dielectric layer 21, and first and second impurity region layers 23 and 24 formed in a surface layer of the semiconductor substrate 2, which define source/drain regions. The transistor 4 is conductively connected to the plug 6 formed on the second impurity region layer 24. Also, the transistors 4 are formed in plurality, spaced from one another in the semiconductor substrate 2, and mutually insulated by element isolation regions 25 provided between adjacent ones of the transistors 4.

Manufacturing Method for Ferroelectric Memory Device

Next, a manufacturing method for the above-described ferroelectric memory device 1 is described with reference to FIG. 2. FIG. 2 is a figure for describing a process for manufacturing the ferroelectric memory device. At first, first and second impurity region layers 23 and 24 are formed in a surface layer of a semiconductor substrate 2, and transistors 4 and an interlayer dielectric film 5 are formed on the semiconductor substrate 2, in a manner similar to the prior art. Then, an opening section 5A is formed in the interlayer dielectric film 5, and a conductive material, such as, for example, tungsten (W) is filled in the opening section 5A, thereby forming a plug 6.

Figure 2A:
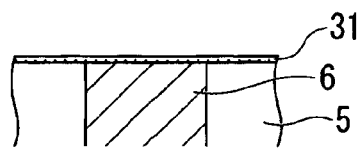
FIGS. 2A to 2H are cross-sectional views showing steps of a manufacturing method for the ferroelectric memory device shown in FIG. 1.
Figure 2B:
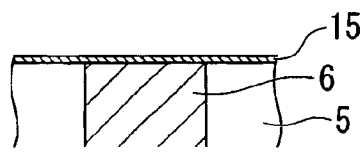

Then, a base layer 11 is formed on the interlayer dielectric film 5 and the plug 6. First, a base forming layer 31 composed of Ti is formed on the interlayer dielectric film 5 and the plug 6 (FIG. 2A). As the method for forming the base forming layer 31, for example, a CVD method or a sputter method may be used. Titanium (Ti) composing the base forming layer 31 generally has a high self-orientation property, and therefore forms a layer in a hexagonal close-packed structure having a (001) orientation when formed by a CVD method or a sputter method. Accordingly, the base forming layer 31 exhibits a (001) orientation by its self-orientation property. Then, a nitration treatment is applied to the base forming layer 31, whereby the base forming layer 31 is changed to a base layer 11 (FIG. 2B). In this treatment, a heat treatment (at 500° C. to 650° C.) in a nitrogen atmosphere is conducted to nitride the base forming layer 31. By setting the heat treatment temperature to be less than 650° C., impacts on the characteristic of the transistor 4 can be controlled, and by setting the heat treatment temperature to be greater than or equal to 550° C., the notarization treatment can be shortened. The formed base layer 11 is composed of TN (titanium nitride) in a (111) orientation, reflecting the orientation of the source metal Ti.

Figure 2C:
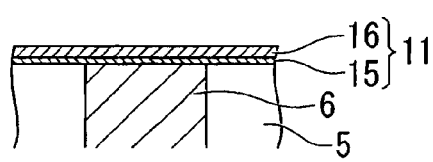

Then, a barrier layer 16 is formed on the base layer 11 (FIG. 2C). In this step, the lattice structure of the base layer 11 and the lattice structure of the barrier layer 16 are made to match each other at an interface between the base layer 11 and the barrier layer 16 to be formed, whereby the barrier layer 16 is epitaxially formed on the base layer 11. By this, the barrier layer 16 having a (111) orientation, reflecting the (111) orientation of the base layer 11, is formed. In this case, by forming the barrier layer 16 from TiAlN having crystalline, as described above, the barrier layer 16 can be oriented in <111>. As the method for forming the barrier layer 16, any appropriate forming method may be selected depending on the material composing the barrier layer 16, and for example, a sputter method and a CVD method can be enumerated.

Next, a lower electrode forming step is conducted for forming a lower electrode 12 on the barrier layer 16. The lower electrode forming step includes an electrode film forming step and an electrode oxide film forming step.

Figure 2D:
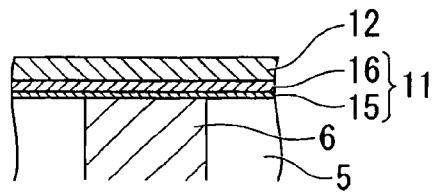

First, the electrode film forming step is conducted (FIG. 2D). In this step, a lower electrode 12 is formed on the barrier layer 16 having crystalline, whereby the crystallinity of the lower electrode 12 is considerably improved, and the crystal orientation of the barrier layer 16 is reflected on the lower electrode 12. By this, the crystal orientation of the lower electrode 12 shows (111), which is the same as that of the barrier layer 16. As the method for forming the lower electrode 12, any appropriate forming method can be selected depending on the material composing the lower electrode 12, and for example, a sputter method and a CVD method may be enumerated.

Figure 2E:
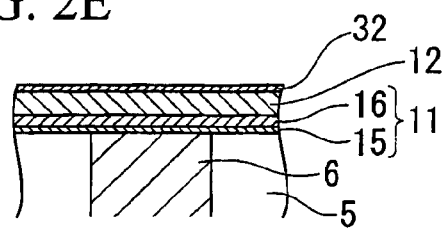

Next, the electrode oxide film forming step is conducted (FIG. 2E). In this step, while supplying oxygen gas onto the lower electrode 12, a Ir film, which is the material composing the lower electrode 12, is formed by a sputter method, whereby an electrode oxide film 32 composed of iridium oxide ($IrO_2$) that is an oxide of Ir is formed on the lower electrode 12. By using a sputter method, the electrode oxide film 32 is formed in a uniform film thickness. Also, the film thickness of the electrode oxide film 32 is, for example, greater than or equal to 20 nm but less than or equal to 30 nm.

In this instance, the electrode oxide film 32 is formed at lower temperatures compared to a method using thermal oxidation, thermal influence on other elements that have already been formed, such as, the transistors 4, is reduced. Also, the ratio of the oxygen gas supplied inside the chamber during the film formation by sputtering may be 30% in a mole ratio in a mixed gas of the oxygen gas and other gas such as inert gas supplied together. By this, the electrode oxide film 32 that is sufficiently oxidized is formed. The ratio of the oxygen gas during the film formation by sputtering may preferably be greater than or equal to 20% but less than or equal to 40%.

Figure 2F:
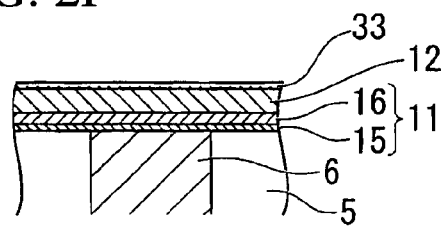

Then, a first ferroelectric layer forming step is conducted for forming a first ferroelectric layer 33 on the electrode oxide film 32 (FIG. 2F). In this step, by using a MOCVD method in which a mixed gas of organometallic source material gas and oxygen gas is supplied, the first ferroelectric layer 33 is formed on the electrode oxide film 32. As the organometallic source material gas, for example, Pb (DIBM) [Pb ($C_9H_{15}O_2$)$_2$: lead-bis(diisobutyrylmethanato)], Zr (DIBM) [Zr ($C_9H_{15}O_2$)$_2$: zirconium (diisobutyrylmethanato)], and Ti $(OiPr)_2(DPM)_2$ [Ti (O-i-$C_3H_7$)$_2$ ($C_{11}H_{19}O_2$)$_2$: titanium (diisopropoxy)(diisobutyrylmethanato)] are used. As the organometallic source material gas, other materials, such as, Pb $(DPM)_2$[Pb ($C_{11}H_{19}O_2$)$_2$: lead (dipivaloylmethanate)], Zr $(IBPM)_4$ [Zr ($C_{10}H_{17}O_2$)$_2$: zirconium tetrakis (isobutyrylpivaloylmethanato)], and Ti $(OiPr)_2(DPM)_2$.

The supplied organometallic source material gas is decomposed and oxidized when reacting with oxygen gas, and then deposited as crystallized PZT on the electrode oxide film 32. As a result, the first ferroelectric layer 33 is formed on the electrode oxide film 32.

In this instance, the flow amount of oxygen gas is less than the amount of oxygen necessary for reaction of the organometallic source material gas. For example, the amount of oxygen is 0.33 times the amount of oxygen necessary for reaction of the organometallic source material gas. In other words, a necessary amount of oxygen for reaction of the supplied organometallic source material gas is not sufficiently supplied. In this embodiment, the amount of oxygen necessary for reaction of the organometallic source material gas is the sum of the amount of oxygen required for burning carbon and hydrogen originated from the organometallic source material gas and releasing them as CO2 and H2O, and the amount of oxygen required for crystallizing ferroelectric materials composing the ferroelectric layer.

Therefore, the organometallic source material gas, while depriving oxygen from $IrO_2$ composing the electrode oxide film 32, is decomposed and oxidized, thereby becoming crystallized PZT and being deposited on the electrode oxide film 32 as the first ferroelectric layer 33.

On the other hand, the electrode oxide film 32 is reduced when oxygen in $IrO_2$ composing the electrode oxide film 32 is deprived, thereby becoming to have the same composition as that of the lower electrode 12 composed of Ir, and integrated with the lower electrode 12. In this instance, the crystal orientation of the integrated lower electrode 12 is in <111>. By this, the crystal orientation of the first ferroelectric layer 33 becomes to be in the same orientation of the lower electrode 12 which is in <111>.

The film thickness of the electrode oxide film 32 may be made greater than or equal to 20 nm but less than or equal to 30 nm, whereby the electrode oxide film 32 transmits the surface structure ((111) orientation) of the lower electrode 12 to the first ferroelectric layer 33, and the crystal orientation of the first ferroelectric layer 33 becomes the same as that of the lower electrode 12, which is a (111) orientation.

Furthermore, by setting the ratio of oxygen gas during the formation of the electrode oxide film 32 to be greater than or equal to 20% but less than or equal to 40%, the electrode oxide film 32 is plentifully oxidized and is prevented from becoming closer to a metallic state, and the surface structure (orientation) of the lower electrode 12 (Ir) disposed therebelow is prevented from becoming impossible to be transmitted to the first ferroelectric layer 33 due to excessive oxidation.

Figure 2G:
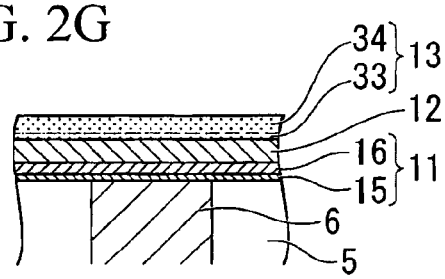

Next, a second ferroelectric layer forming step is conducted for forming a second ferroelectric layer 34 on the first ferroelectric layer 33 (FIG. 2G). In this step, the second ferroelectric layer 34 is formed on the first ferroelectric layer 33 by using a MOCVD method, like the first ferroelectric layer forming step described above.

In this instance, the flow amount of oxygen gas is greater than the amount of oxygen necessary for reaction of the organometallic source material gas. For example, the amount of oxygen is 6.77 times the amount of oxygen necessary for reaction of the organometallic source material gas. In other words, a necessary amount of oxygen for reaction of organic constituents in the supplied organometallic source material gas is sufficiently supplied.

As a result, the organometallic source material gas, while depriving oxygen in the supplied oxygen gas, is decomposed and oxidized, thereby becoming crystallized PZT and being deposited on the first ferroelectric layer 33 as the second ferroelectric layer 34. The crystal orientation of the second ferroelectric layer 34 is controlled to be in a (111) orientation with the first ferroelectric layer 33 which is in a (111) orientation acting as a seed layer. Also, by forming the second ferroelectric layer 34 in an atmosphere containing an ample supply of oxygen, the second ferroelectric layer 34 can be formed in high quality with few oxygen deficiencies. By the steps described above, a ferroelectric layer 13 which is in a (111) orientation is formed with the first and second ferroelectric layers 33 and 34.

Figure 2H:
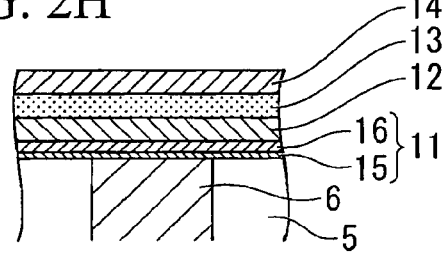

Then, an upper electrode forming step for forming an upper electrode 14 on the ferroelectric layer 13 is conducted (FIG. 2H). In this step, as the method for forming the upper electrode 14, any appropriate forming method may be selected depending on the material composing the upper electrode 14, and for example, a sputter method and a CVD method can be enumerated.

Then, a resist layer (not shown) having an opening in a predetermined pattern shape is formed on the upper electrode 14, and patterning is conducted, using the resist layer as a mask. By this, a ferroelectric memory device 1 having the stacked type ferroelectric capacitor 3 is manufactured.

Figure 3:
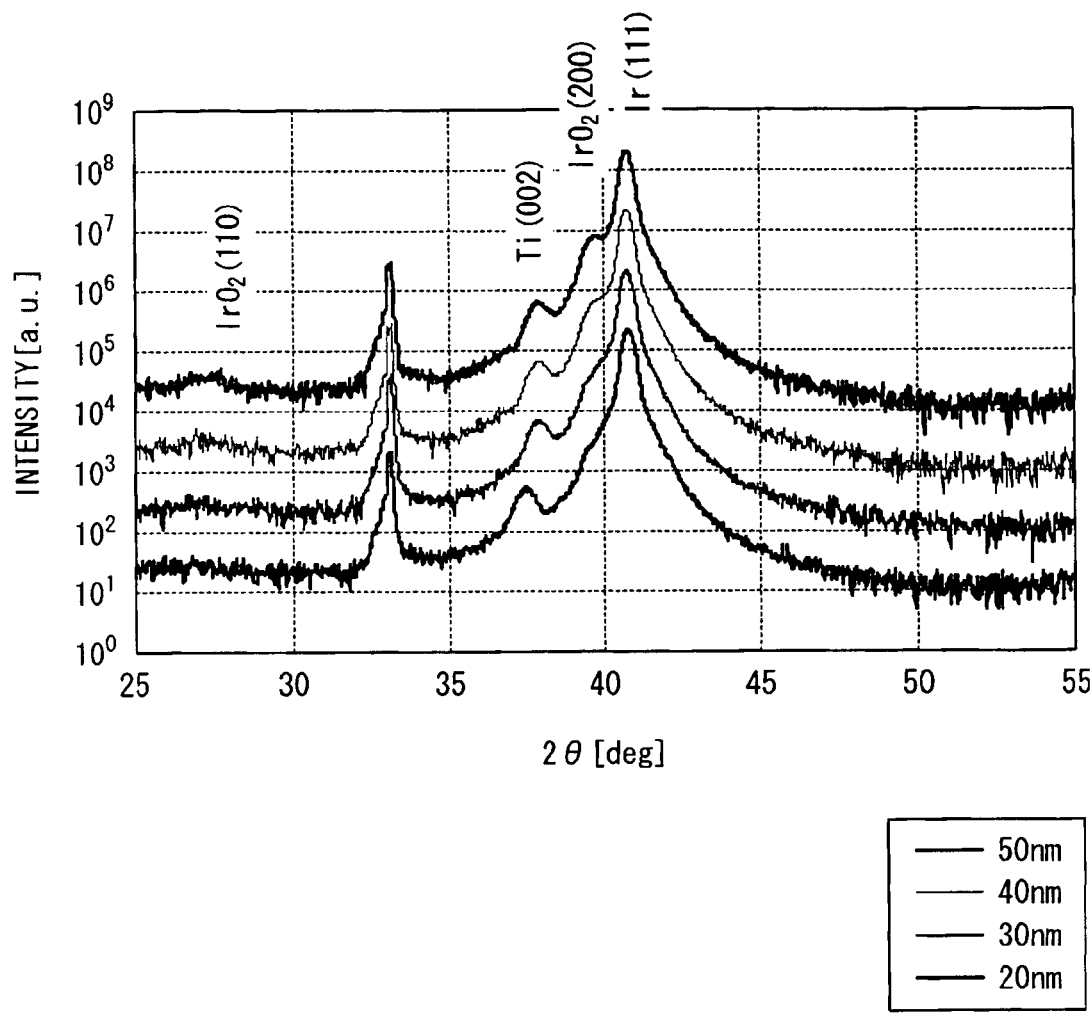
FIG. 3 is a view showing X-ray diffraction patterns of $IrO_2$ films formed on Ir films.
Figure 4:
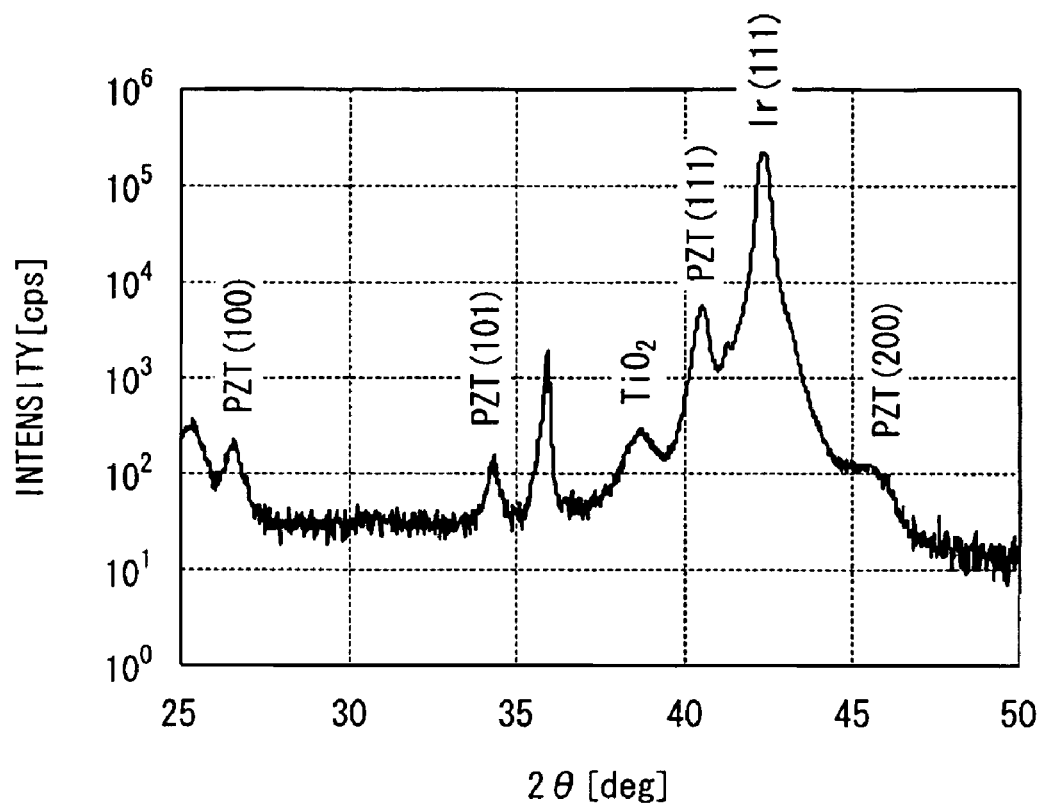
FIG. 4 is a view showing an X-ray diffraction pattern of a PZT film formed on an $IrO_2$ film.
Figure 5:
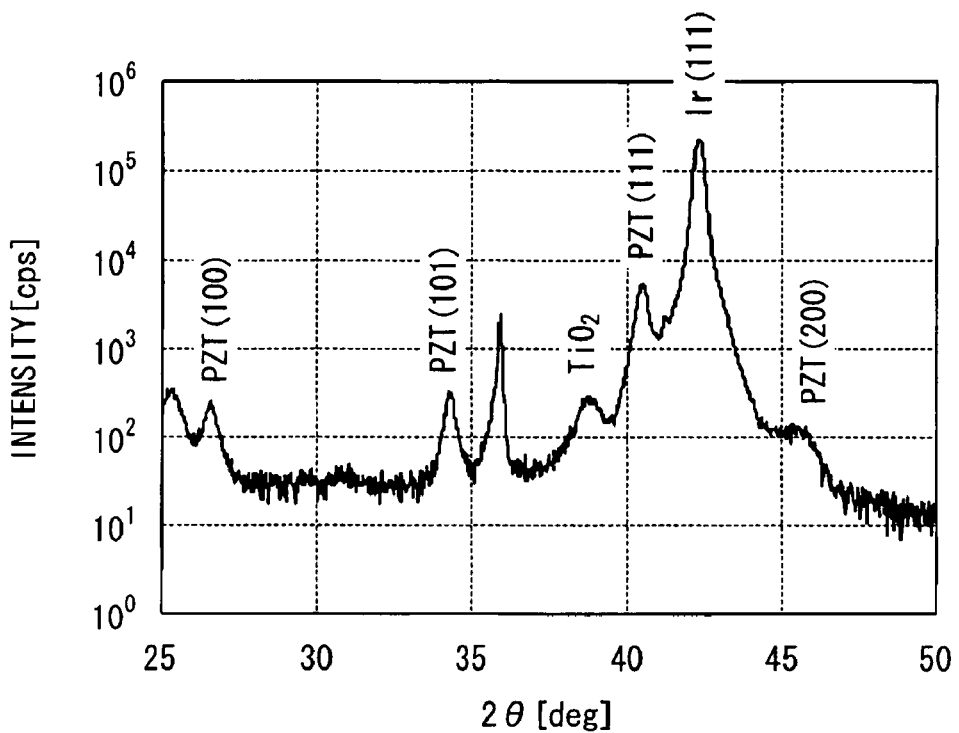
FIG. 5 is a view similarly showing an X-ray diffraction pattern of a PZT film formed on an $IrO_2$ film.
Figure 6:
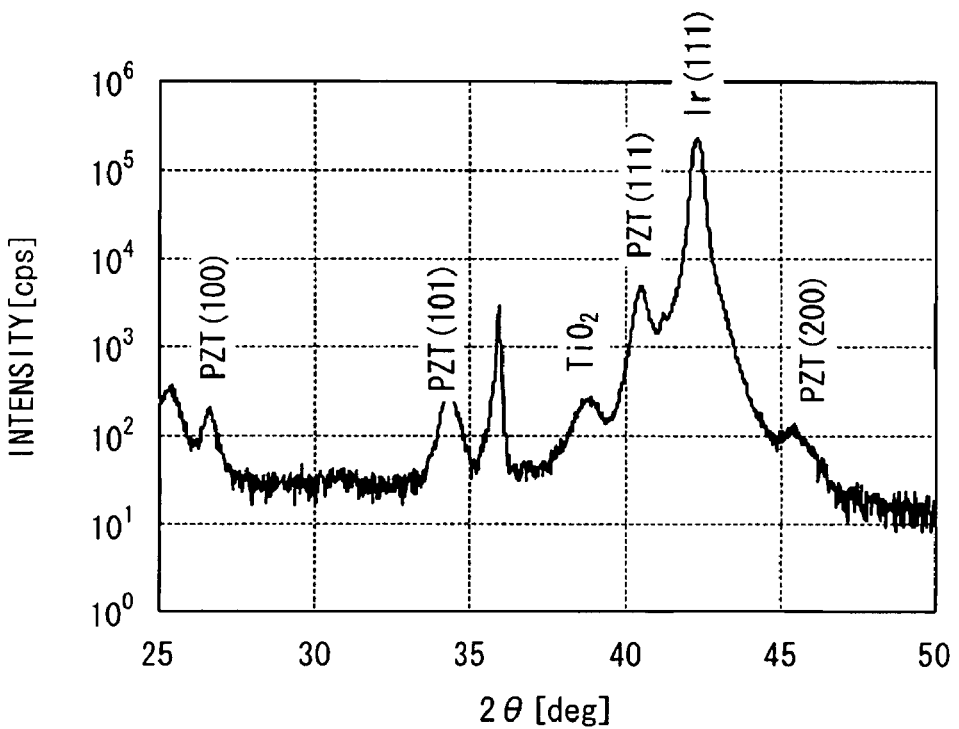
FIG. 6 is a view similarly showing an X-ray diffraction pattern of a PZT film formed on an $IrO_2$ film.
Figure 7:
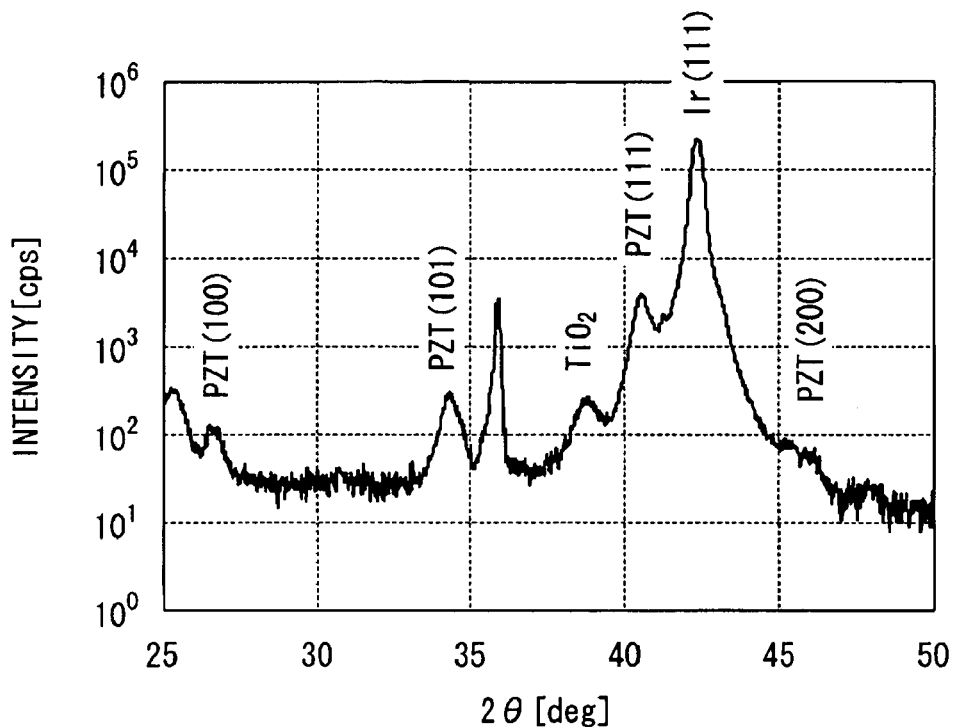
FIG. 7 is a view similarly showing an X-ray diffraction pattern of a PZT film formed on an $IrO_2$ film.

FIG. 3 shows X-ray diffraction patterns of IrO$_2$ films (electrode oxide films 32) in different thicknesses formed on an Ir film (lower electrode 12) which is in a (111) orientation The film thickness of the IrO$_2$ film is changed from 20 nm to 50 nm. As shown in FIG. 3, in each of the film thicknesses, a diffraction line of the IrO$_2$ is obtained, whereby it can be confirmed that a crystalline IrO$_2$ film is formed.

Figure 8:
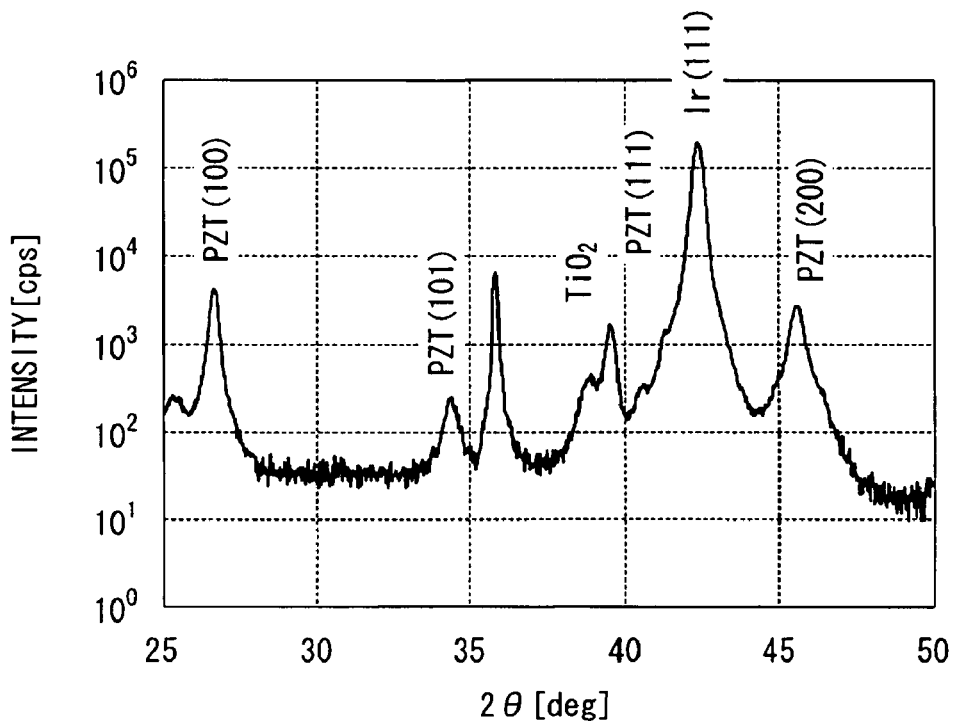
FIG. 8 is a view similarly showing an X-ray diffraction pattern of a PZT film directly formed on an Ir film.

Next, FIGS. 4 to 7 show X-ray diffraction patterns of PZT films (ferroelectric layers 13) formed by a MOCVD method on an upper surface of an IrO$_2$ film (electrode oxide film 32) that is formed on an Ir film (lower electrode 12) which is in a (111) orientation. FIGS. 4 to 7 show X-ray diffraction patterns when the film thickness of the IrO$_2$ film is 20 nm, 30 nm, 40 nm, and 50 nm, respectively. Also, FIG. 8 shows an X-ray diffraction pattern of a PZT film formed by a MOCVD method on an Ir film which is in a (111) orientation, without forming an IrO$_2$ film on the Ir film.

As shown in FIGS. 4 to 7, in any of the different film thicknesses of the IrO$_2$ film, it is observed that the PZT film is preferentially oriented in <111>. When the PZT film is formed on the Ir film without forming an IrO$_2$ film, it is observed, as shown in FIG. 8, that the PZT film is preferentially oriented in <100>, not in <111>. Accordingly, it is confirmed that, by forming the IrO$_2$ film, the PZT film can be preferentially oriented in <111>.

Figure 9:
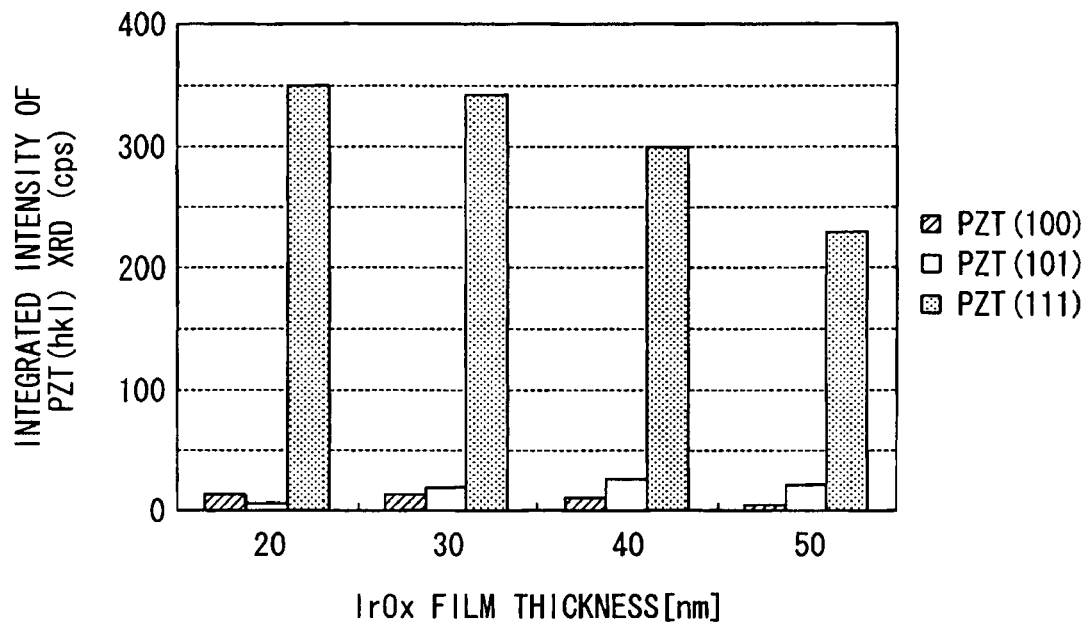
FIG. 9 is a graph showing diffraction intensities of PZT films formed on $IrO_2$ films.
Figure 10:
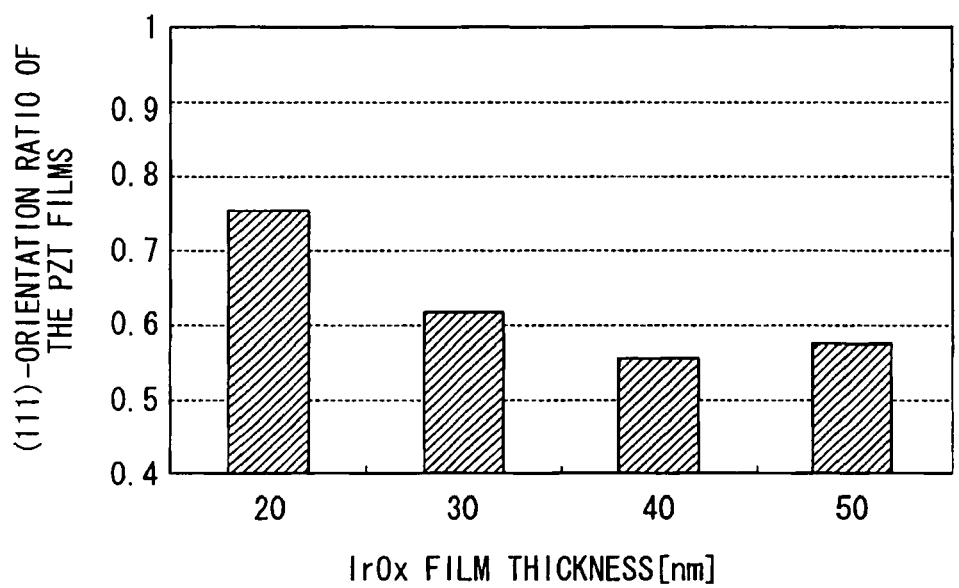
FIG. 10 is a graph showing the orientation ratio of PZT films formed on $IrO_2$ films.

Diffraction intensities of PZT films (ferroelectric layers 13) formed on an IrO$_2$ film (electrode oxide film 32) in different film thicknesses, and their (111)-orientation ratios are shown in FIG. 9 and FIG. 10, respectively. The (111)-orientation ratio is defined by the following formula (111)-orientation ration=$I(222)/\Sigma I(hkl)$ In this formula, I (hkl) indicates the (hkl) diffraction intensity of a PZT film.

As shown in FIG. 9 and FIG. 10, the (111) diffraction intensity in a PZT film decreases with an increase in the film thickness of an IrO$_2$ film. It is also observed that the (111) orientation ratio of a PZT film also decreases as the film thickness of an IrO$_2$ film increases. By this, it is understood that the orientation of a PZT film depends on the film thickness of an IrO$_2$ film. Accordingly, it can be confirmed that the film thickness of an IrO$_2$ film is preferably less than or equal to 30 nm.

Figure 11:
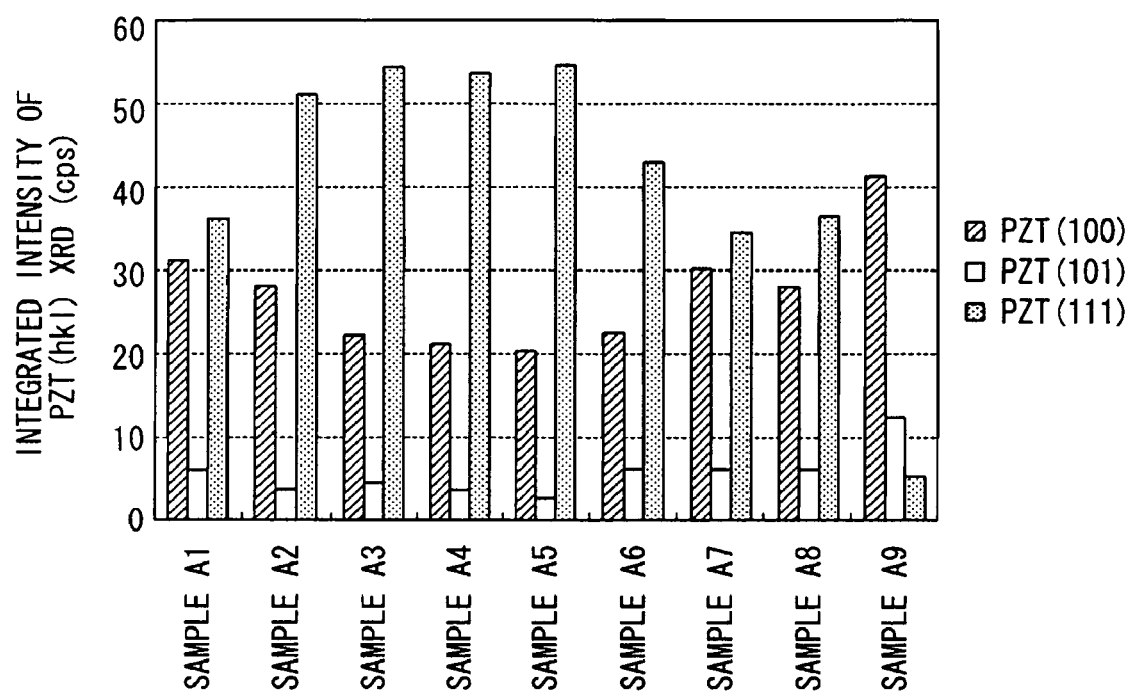
FIG. 11 is a graph showing oxygen ratios during the film formation by sputtering and diffraction intensities of PZT films.

FIG. 11 shows the relation between the ratio of oxygen gas during the film formation of an IrO$_2$ (electrode oxide film 32) by sputtering and the X-ray diffraction intensity obtained from a PZT film (ferroelectric layer 13). In this examination, the ratio of oxygen gas is 20% in Samples A1 and A2, the ratio of oxygen gas is 30% in Samples A3 and A4, the ratio of oxygen gas is 40% in Samples A5 and A6, the ratio of oxygen gas is 50% in Samples A7 and A8, and the ratio of oxygen gas is 60% in Sample A9.

As shown in FIG. 11, when the ratio of oxygen gas is set to approximately 30% (greater than or equal to 20% but less than or equal to 40%), the (111)-orientation ratio of a PZT film becomes higher, which is understood to depend on the oxidation state of an IrO$_2$ film. This is believed to be caused by the fact that, when the ratio of oxygen gas is decreased to be less than or equal to 30%, an IrO$_2$ film becomes closer to a metallic state, such that oxygen cannot be sufficiently supplied from the IrO$_2$ film to the first ferroelectric layer 33 in the first ferroelectric layer forming step. Also, it is believed to be caused by the fact that, when the ratio of oxygen gas is increased to be greater than or equal to 30%, a sufficiently oxidized IrO$_2$ film can be obtained, but the IrO$_2$ film becomes too stable and becomes difficult to be reduced, such that the orientation of the Ir layer (lower electrode layer 12) cannot be transmitted to the first ferroelectric layer 33.

Figure 12:
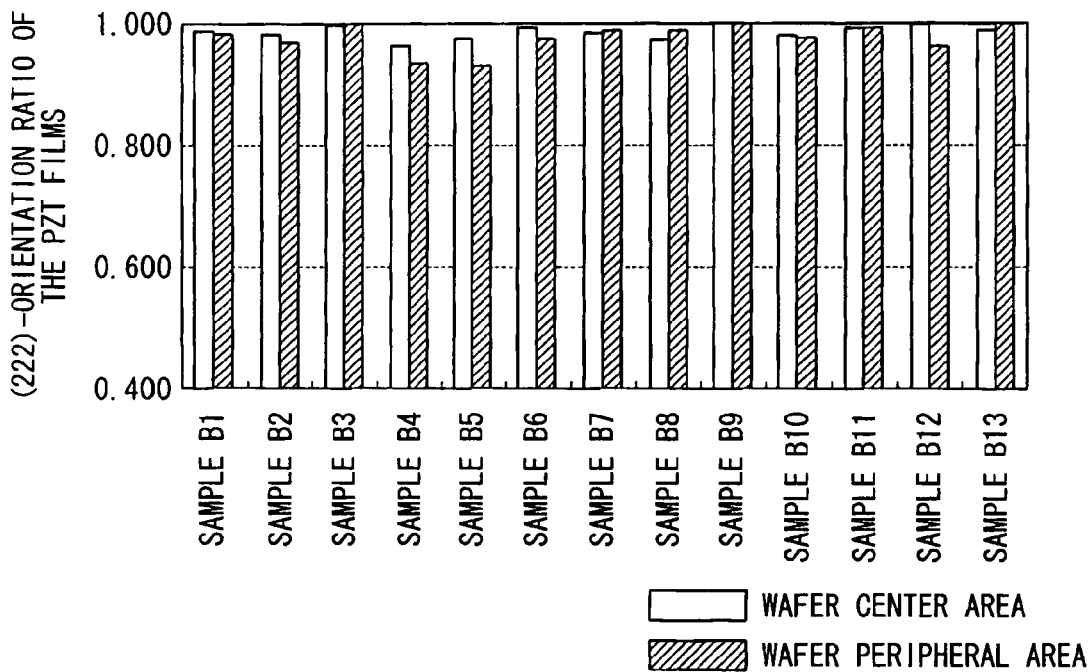
FIG. 12 is a graph showing the orientation ratio of PZT films according to a manufacturing method in accordance with an embodiment of the invention.
Figure 13:
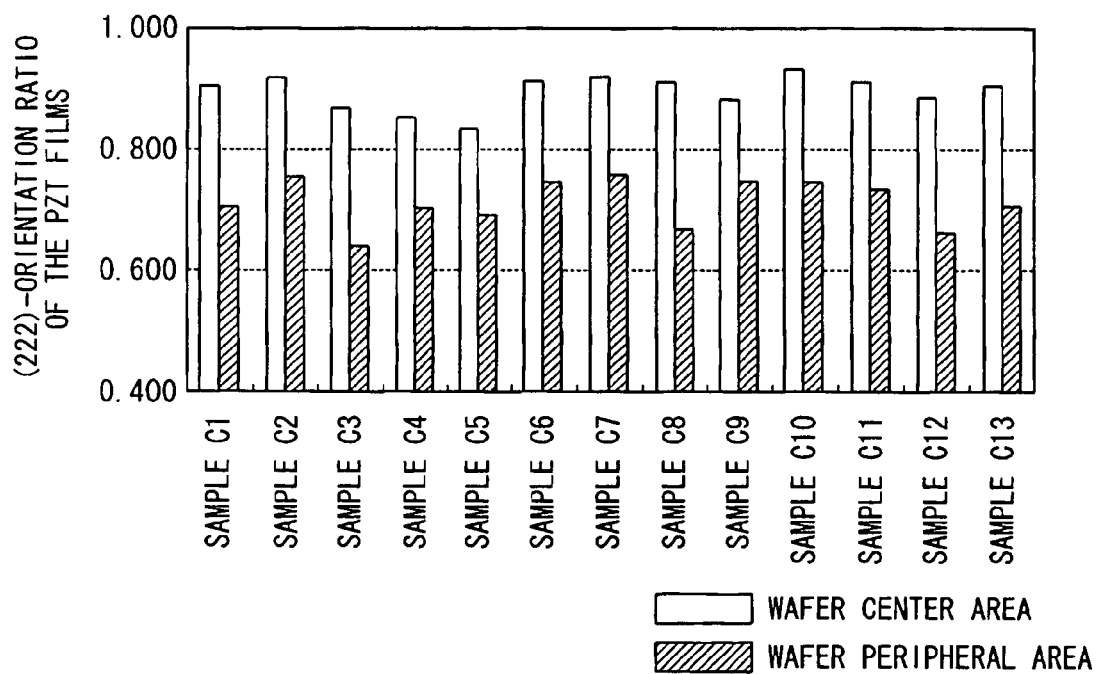
FIG. 13 is a graph showing the orientation ratio of PZT films according to a prior art manufacturing method.

Next, FIGS. 12 and 13 show the (222) orientation ratio of a PZT film (ferroelectric layer 13) formed by the manufacturing method for a ferroelectric memory device in accordance with this embodiment, and the (222) orientation ratio of a PZT film formed by a prior art manufacturing method, respectively. Specifically, Samples B1 to B13 shown in FIG. 12 each indicate the (222) orientation ratio of a PZT film formed on each of independent wafers by using the manufacturing method for a ferroelectric memory device in accordance with this embodiment. Samples C1 to C13 shown in FIG. 13 each indicate t the (222) orientation ratio of a PZT film formed on each of independent wafers by using the prior art manufacturing method. Also, in each of the samples, a bar graph on the left side indicates the orientation ratio in a center area of a wafer, and a bar graph on the right side indicates the orientation ratio in a peripheral area of the wafer.

As shown in FIG. 12 and FIG. 13, the PZT films formed by the manufacturing method in accordance with this embodiment have a higher degree of (111)-orientation, compared to the PZT films formed by the prior art manufacturing method. Also, in the PZT films formed by the manufacturing method in accordance with this embodiment, the difference in the orientation ratio between the center area and the peripheral area of each of the wafers is small, and therefore it is understood that the uniformity in the orientation ratio on the whole area of the wafer is excellent. Furthermore, in the PZT films formed by the manufacturing method in accordance with this embodiment, the orientation ratio has few differences among the wafers, and therefore it is understood that the uniformity in the orientation ratio among the wafers is excellent.

Therefore, according to the manufacturing method for a ferroelectric memory device in accordance with this embodiment, the film quality of the electrode oxide film 32 can be more readily controlled, compared to the case where an oxide film is formed in a surface layer of the lower electrode 12 by applying a thermal oxidation treatment to the lower electrode 12. In other words, the control of the film thickness of the electrode oxide film 32 becomes easier, such that the electrode oxide film 32 can be uniformly formed in a thick film. By this, the first ferroelectric layer 33 that is formed on the electrode oxide film 32 can be formed to have a required crystal orientation, and differences therein can be reduced.

Also, by using a sputter method, the electrode oxide film 32 having a uniform film thickness can be readily formed. By setting the film thickness of the electrode oxide film 32 to be greater than or equal to 20 nm but less than or equal to 30 nm, the orientation ratio of the ferroelectric layer 13 can be made higher degree. Then, the electrode oxide film 32 can be formed at lower temperatures, compared to the case where the oxide film is formed by applying a thermal oxidation treatment, such that thermal impacts on other elements that have been already formed, such as, the transistors 4, can be reduced.

Furthermore, by setting the partial pressure of oxygen gas to be greater than or equal to 20% but less than or equal to 40%, the formed electrode oxide film 32 can be sufficiently oxidized, and prevented from becoming excessively stabilized (as it becomes difficult to be reduced), thereby preventing the orientation of the lower electrode layer 12 (Ir) from becoming impossible to be transmitted to the first ferroelectric layer 33 (PZT), and the first ferroelectric layer can be more stably made in a required crystal orientation.

The invention is not limited to this embodiment described above, and many changes can be made within the range that does not depart from the subject matter of the invention.

For example, as long as the electrode oxide film can be formed on the lower electrode at lower temperatures compared to the case where a surface layer of the lower electrode is oxidized by thermal treatment, other methods such as a CVD method may be used, instead of a sputter method.

Also, in the first ferroelectric layer forming step described above, the amount of oxygen in the oxygen gas is 0.33 times the amount of oxygen necessary for reacting the organometallic source material gas, but can be in a different ratio if the first ferroelectric layer forming step causes a reducing atmosphere and the first ferroelectric layer has a crystal orientation that is the same as that of the lower electrode. Similarly, in the second ferroelectric layer forming step, the amount of oxygen in the oxygen gas is 6.77 times the amount of oxygen necessary for reacting the organometallic source material gas, but can be in a different ratio if the second ferroelectric layer can be formed without oxygen deficiencies.

Furthermore, in the first ferroelectric layer forming step described above, the entirety of the electrode oxide film is reduced. A portion of the electrode oxide film including at least its topmost layer may be reduced.

Also, the partial pressure of oxygen in an atmospheric gas during the sputter-deposition is set to be greater than or equal to 20% but less than or equal to 40% in accordance with this embodiment described above. However, the partial pressure may be in different values if a sufficiently oxidized electrode oxide film can be formed, and the first ferroelectric layer having a required crystal orientation can be formed.

Also, in this embodiment described above, the film thickness of the electrode oxide film is set to be greater than or equal to 20 nm but less than or equal to 30 nm, but can be in different values if the ferroelectric layer can be formed in a required crystal orientation.

What is claimed is:

1. A manufacturing method for a ferroelectric memory device having a ferroelectric capacitor, the method comprising:
   forming a lower electrode;
   forming, on the lower electrode, an electrode oxide film composed of an oxide of a constituent material of the lower electrode;
   forming a first ferroelectric layer on the lower electrode by reaction between organometallic source material gas and oxygen gas;
   forming a second ferroelectric layer on the first ferroelectric layer by reaction between organometallic source material gas and oxygen gas; and
   forming an upper electrode on the second ferroelectric layer, wherein
   the oxygen gas in the forming of the first ferroelectric layer is in an amount less than the amount of oxygen necessary for reaction of the organometallic source material gas, and wherein
   the oxygen gas in the forming of the second ferroelectric layer is in an amount greater than the amount of oxygen necessary for reaction of the organometallic source material gas.

2. A manufacturing method for a ferroelectric memory device according to claim 1, wherein,
   the electrode oxide film is formed by a sputter method in the forming of the electrode oxide film.

3. A manufacturing method for a ferroelectric memory device according to claim 2, wherein,
   a partial pressure of oxygen gas in an atmospheric gas during sputtering is greater than or equal to 20% but less than or equal to 40% in the forming of the electrode oxide film.

4. A manufacturing method for a ferroelectric memory device according to claim 1, wherein
   the electrode oxide film has a film thickness less than or equal to 30 nm.

5. A manufacturing method for a ferroelectric memory device according to claim 1, wherein
   the amount of oxygen in the forming of the first ferroelectric layer is greater than or equal to 0.1 times but less than 1.0 times the amount of oxygen necessary for reaction of the organometallic source material gas.

6. A manufacturing method for a ferroelectric memory device according to claim 1, wherein
   the amount of oxygen in the forming of the second ferroelectric layer is greater than or equal to 1.0 times the amount of oxygen necessary for reaction of the organometallic source material gas.

* * * * *